United States Patent
Chiu

(10) Patent No.: US 9,171,980 B2
(45) Date of Patent: Oct. 27, 2015

(54) PHOTOVOLTAIC APPARATUS, PHOTOVOLTAIC MODULE AND FASTENER THEREOF

(71) Applicant: AU Optronics Corporation, Hsin-Chu (TW)

(72) Inventor: Sih-Siou Chiu, Hsin-Chu (TW)

(73) Assignee: AU OPTRONICS CORPORATION, Hsin-Chu (TW)

(*) Notice: Subject to any disclaimer, the term of this patent is extended or adjusted under 35 U.S.C. 154(b) by 16 days.

(21) Appl. No.: 14/132,400

(22) Filed: Dec. 18, 2013

(65) Prior Publication Data

US 2014/0182678 A1 Jul. 3, 2014

(30) Foreign Application Priority Data

Dec. 31, 2012 (CN) .......................... 2012 1 0592846

(51) Int. Cl.
| | | |
|---|---|---|
| *H01L 31/042* | (2014.01) | |
| *H02S 30/10* | (2014.01) | |
| *H02S 20/22* | (2014.01) | |
| *F24J 2/52* | (2006.01) | |

(52) U.S. Cl.
CPC ............. *H01L 31/042* (2013.01); *F24J 2/5211* (2013.01); *F24J 2/5245* (2013.01); *F24J 2/5258* (2013.01); *F24J 2/5262* (2013.01); *F24J 2/5264* (2013.01); *H02S 20/22* (2014.12); *H02S 30/10* (2014.12); *Y02B 10/12* (2013.01); *Y02E 10/47* (2013.01); *Y02E 10/50* (2013.01); *Y10T 24/44026* (2015.01)

(58) Field of Classification Search
CPC ........ Y02B 10/10; Y02B 10/12; Y02B 10/14; Y02E 10/47; Y02E 10/50; Y02E 10/52; H02S 20/00; H02S 30/00; H02S 40/00; H01L 31/042; H01L 31/0422; H01L 31/0424; H01L 31/048; F16M 13/022; F16M 11/00
USPC .................................. 52/173.3; 136/244, 251
See application file for complete search history.

(56) References Cited

U.S. PATENT DOCUMENTS

| | | | | |
|---|---|---|---|---|
| 7,592,537 | B1 * | 9/2009 | West .............................. | 136/251 |
| 2011/0000520 | A1 * | 1/2011 | West .............................. | 136/244 |
| 2011/0162315 | A1 * | 7/2011 | Napora et al. ............... | 52/656.9 |
| 2011/0232715 | A1 | 9/2011 | Lenox et al. | |
| 2011/0314752 | A1 * | 12/2011 | Meier .......................... | 52/173.3 |
| 2012/0047827 | A1 * | 3/2012 | Zeilenga et al. ............. | 52/173.3 |
| 2012/0073630 | A1 * | 3/2012 | Wu et al. ....................... | 136/251 |

(Continued)

FOREIGN PATENT DOCUMENTS

| | | | | |
|---|---|---|---|---|
| CN | 101586382 | | 11/2009 | |
| DE | 10356426 A1 * | 6/2005 | ............. | A45B 23/00 |

(Continued)

*Primary Examiner* — Joshua J Michener
*Assistant Examiner* — Matthew Gitlin
(74) *Attorney, Agent, or Firm* — WPAT, PC; Justin King

(57) ABSTRACT

A photovoltaic apparatus includes at least one photovoltaic panel, at least one frame and at least one fastener. The frame includes at least one pair of holding parts, a sidewall and at least one protrusion. The photovoltaic panel is positioned between the holding parts. Part of the sidewall connects the holding parts. The sidewall includes an outside surface opposite to the photovoltaic panel. The protrusion is connected to the outside surface of the sidewall, and includes at least one slot thereon. The fastener includes a buckle part at the top of the fastener. Portion of the buckle part is used for engaged into the slot.

14 Claims, 13 Drawing Sheets

(56) References Cited

U.S. PATENT DOCUMENTS

| | | | |
|---|---|---|---|
| 2012/0079781 A1* | 4/2012 | Koller | 52/173.3 |
| 2012/0138764 A1* | 6/2012 | Kemple | 248/316.1 |
| 2012/0151721 A1* | 6/2012 | Lin | 24/457 |
| 2012/0167364 A1* | 7/2012 | Koch et al. | 29/281.1 |
| 2012/0192925 A1 | 8/2012 | Grushkowitz et al. | |
| 2012/0285535 A1* | 11/2012 | Tago et al. | 136/259 |
| 2012/0285815 A1* | 11/2012 | Johnstone | 202/267.1 |
| 2012/0298817 A1* | 11/2012 | West et al. | 248/220.22 |

FOREIGN PATENT DOCUMENTS

| | | |
|---|---|---|
| TW | M387229 | 8/2010 |
| TW | M405133 | 6/2011 |
| TW | 201203571 | 1/2012 |

* cited by examiner

US 9,171,980 B2

PHOTOVOLTAIC APPARATUS, PHOTOVOLTAIC MODULE AND FASTENER THEREOF

RELATED APPLICATIONS

This application claims priority to China Application Serial Number 201210592846.X, filed Dec. 31, 2012, which is herein incorporated by reference.

BACKGROUND

1. Technical Field

Embodiments of the invention relate to a photovoltaic apparatus. More particularly, embodiments of the invention relate to a photovoltaic apparatus, a photovoltaic module and a fastener thereof.

2. Description of Related Art

Since petroleum reserves are decreasing gradually, the energy crisis has become an issue all over the world in recent year, and therefore, it is necessary to develop an alternative energy immediately. In these alternative energy options on the table, the solar energy is under the spotlight due to its unexhausted resources.

At present, a method for collecting the solar energy is generally implemented by using a photovoltaic panel. The photovoltaic panel is generally mounted on a roof of a building to receive sunlight to generate electricity. In order to form a photovoltaic panel array on the roof, an worker have to use a plurality of screws or bolts to secure plural rails on the roof in the beginning, and then uses a plurality of screws, bolts or clamps to fasten the photovoltaic panel onto the rails.

Since plural rails and associated mounting hardware are required to mount the photovoltaic panel onto the roof in the aforementioned way, it is inevitably that the material cost and working hours of the worker are increased.

SUMMARY

In view of this, embodiments of the invention provide a photovoltaic apparatus, a photovoltaic module and a fastener thereof that may be assembled rapidly.

According to one embodiment of the invention, a photovoltaic apparatus includes at least one photovoltaic laminate, at least one frame and at least one fastener. The frame is disposed on at least one lateral edge of the photovoltaic laminate, and includes at least a pair of holding parts, a sidewall and at least one protrusion. The photovoltaic laminate is clamped between the holding parts. Part of the sidewall is used for connecting the holding parts. The sidewall has an outside surface opposite to the photovoltaic laminate. The protrusion is connected to the outside surface of the sidewall, and has a slot thereon. The fastener is used for cladding part of the protrusion and includes a buckle part at the top of the fastener. Part of the buckle part is engaged into the slot.

According to another embodiment of the invention, a photovoltaic apparatus includes a first photovoltaic module, a second photovoltaic module and at least one fastener. The first photovoltaic module includes a first photovoltaic laminate and at least one first frame. The first frame is disposed on at least one lateral edge of the first photovoltaic laminate. The first frame includes a pair of first holding parts, a first sidewall and at least one first protrusion. The first photovoltaic laminate is positioned between the first holding parts. Part of the first sidewall is used for connecting the first holding parts. The first sidewall has a first outside surface opposite to the first photovoltaic laminate. The first protrusion is connected to the first outside surface of the first sidewall. The first protrusion has at least one first slot thereon. The second photovoltaic module and the first photovoltaic module are disposed adjacent to each other. The second photovoltaic module includes a second photovoltaic laminate and at least one second frame. The second frame is disposed on at least one lateral edge of the second photovoltaic laminate. The second frame includes a pair of second holding parts, a second sidewall and at least one second protrusion. The second photovoltaic panel is positioned between the second holding parts. Part of the second sidewall is used for connecting the second holding parts. The second sidewall has a second outside surface opposite to the second photovoltaic laminate. The second protrusion is connected to the second outside surface of the second sidewall. The second protrusion has at least one second slot thereon. The first protrusion and the second protrusion are disposed adjacent to each other. The fastener includes a first fastening part, a second fastening part and a connecting part. The first fastening part and the second fastening part are connected bilaterally and symmetrically by the connecting part. The first fastening part includes a first buckle part at the top of the first fastening part. The second fastening part includes a second buckle part at the top of the second fastening part. Part of the first buckle part and part of the second buckle part each are respectively used for engaging to the first slot and/or the second slot.

According to another embodiment of the invention, a photovoltaic module includes a photovoltaic laminate and a plurality of frames. The frames are respectively disposed on a plurality of lateral edges of the photovoltaic laminate. Each frame includes a pair of holding parts, a sidewall and at least one protrusion. The holding parts are used for holding the photovoltaic laminate. Part of the sidewall is used for connecting the holding parts. The sidewall has an outside surface opposite to the photovoltaic laminate. The protrusion is a hollow structure, and connects to the outside surface of the sidewalls. The protrusion includes a slot thereon. According to another embodiment of the invention, a fastener for fastening a photovoltaic module includes a first fastening part. The first fastening part includes a first buckle part and a first limit part. The first buckle part is positioned at the top of the first fastening part. The first limit part is connected to the first buckle part, so that a cross-section of the first fastening part is of a C-shaped structure. The first limit part includes a first terminal subpart, a first horizontal subpart and a first sloping subpart. The first terminal subpart is positioned on the other end part of the first fastening part and opposite to the first buckle part. The first horizontal subpart connects the first buckle part. The first sloping subpart slopes from one end of the first horizontal subpart opposite to the first buckle part toward the first terminal subpart.

In the aforementioned embodiments of the invention, each frame of the photovoltaic module may include the protrusion opposite to the photovoltaic laminate. This protrusion has the slot, which may be used for placing part of the fastener, so as to fasten the photovoltaic laminate to a building structure. Therefore, the photovoltaic laminate can be fastened to the building structure without using the rail and plural screws and bolts locked to the rail, so as to shorten an assembling time and reduce a rail cost as well.

BRIEF DESCRIPTION OF THE DRAWINGS

In order to make the foregoing as well as other objects, features, advantages and embodiments of the invention more apparent, the accompanying drawings are described as follows.

DETAILED DESCRIPTION

Figure 1:
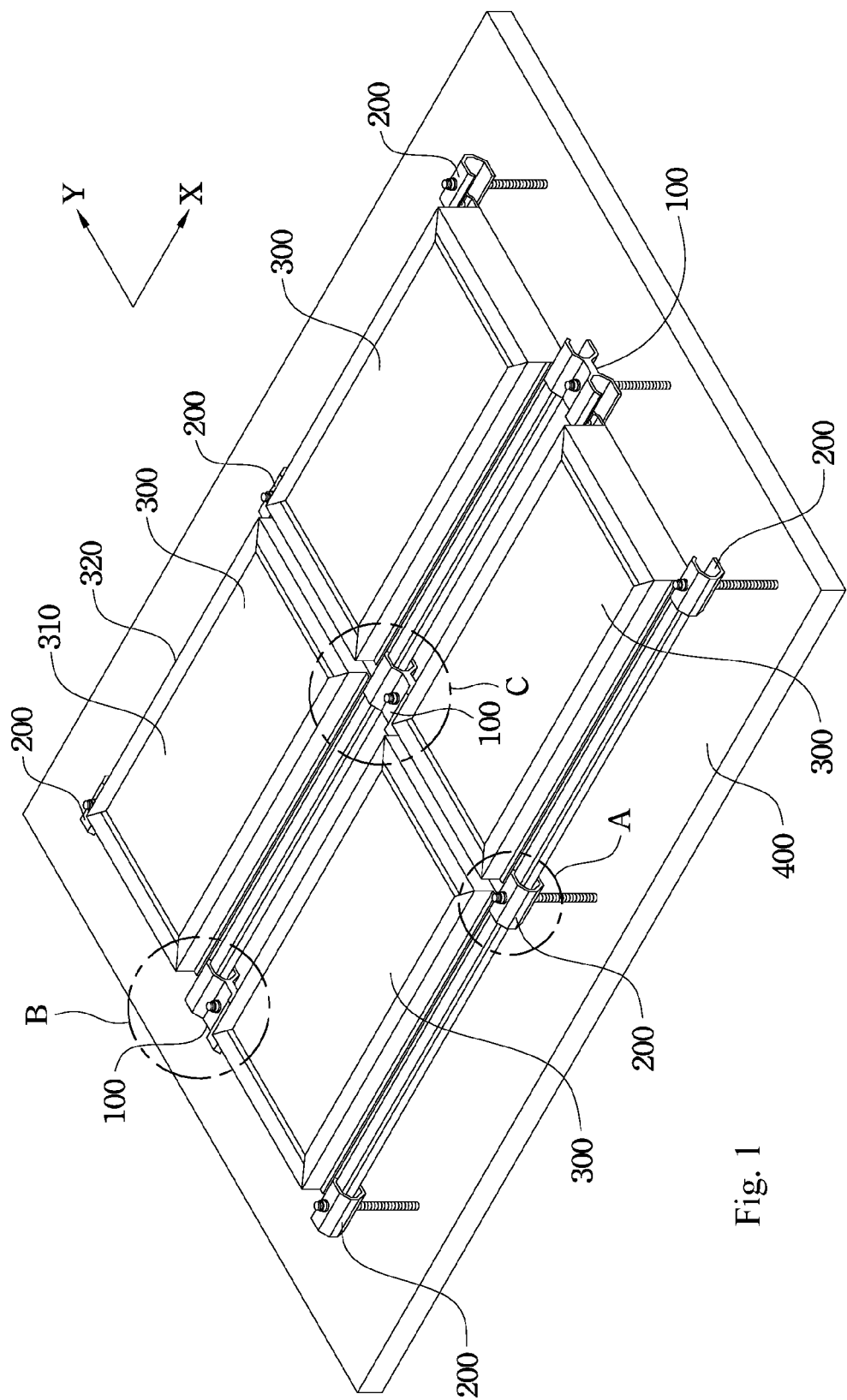
FIG. 1 is a perspective view of a photovoltaic array according to one embodiment of the invention.

A plurality of embodiments of the invention will be depicted with reference to drawings hereinafter, and many details related to coupling PV module and fastener will be described explicitly. However, those skilled in the art should understand that the details in these embodiments of the invention are exemplary, and should not be deemed as limitations of the invention. Besides, in order to present the feature of the invention, some conventional structures and elements will be shown in the drawings without detail.

It should be understood that, words such as "first," "second," "third" and "fourth" refer to elements with similar structural features.

FIG. 1 is a perspective view of the photovoltaic array according to one embodiment of the invention. As shown in FIG. 1, the photovoltaic array in the embodiment may include at least one first fastener 100, at least one second fastener 200 and plural photovoltaic modules 300. Each of the photovoltaic modules 300 includes a photovoltaic laminate 310 and at least one frame 320. Both the first fastener 100 and the second fastener 200 are used for coupling and mounting the frame 320 to a building structure 400.

Figure 2:
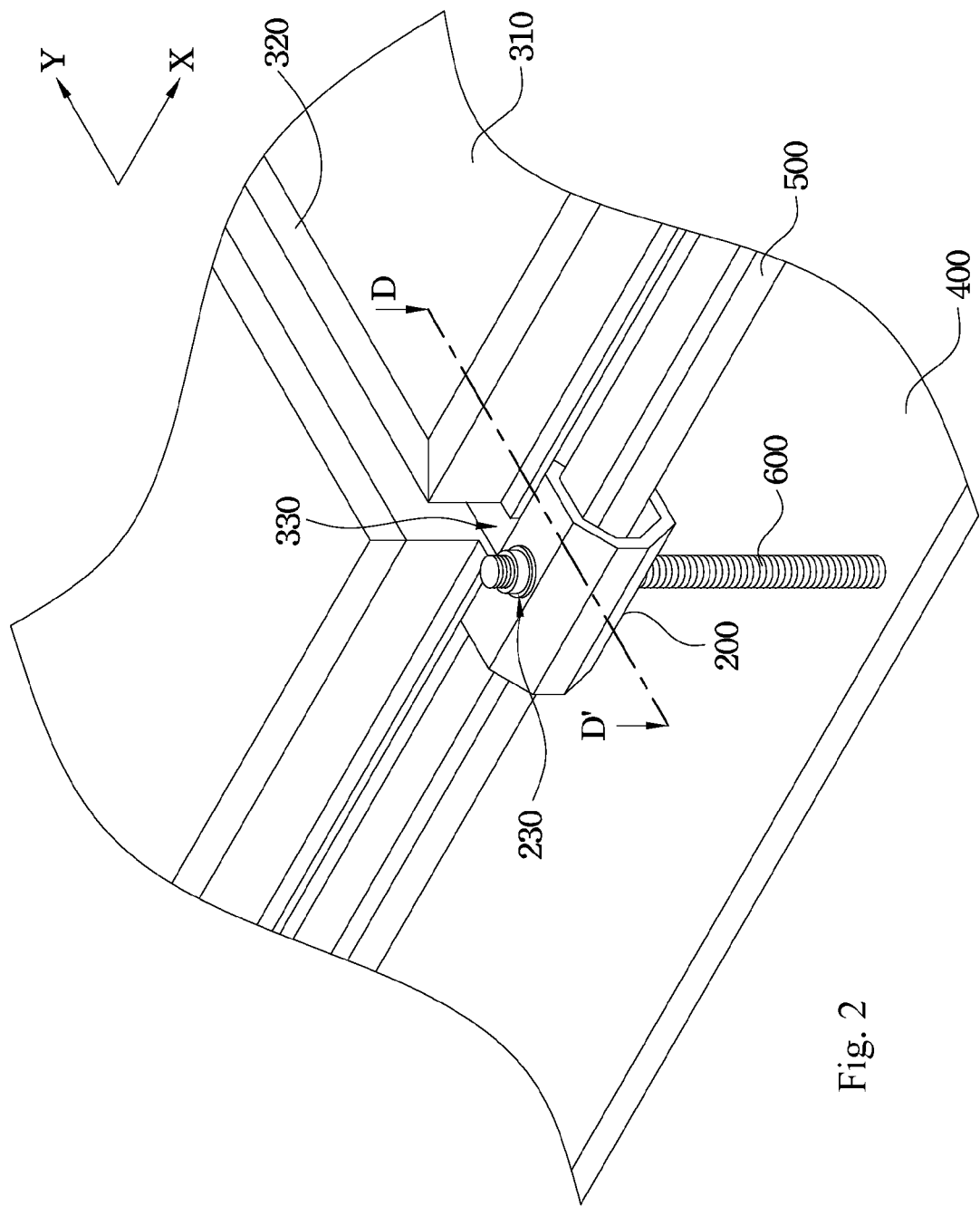
FIG. 2 is a perspective view of a partial region A in FIG. 1.
Figure 3:
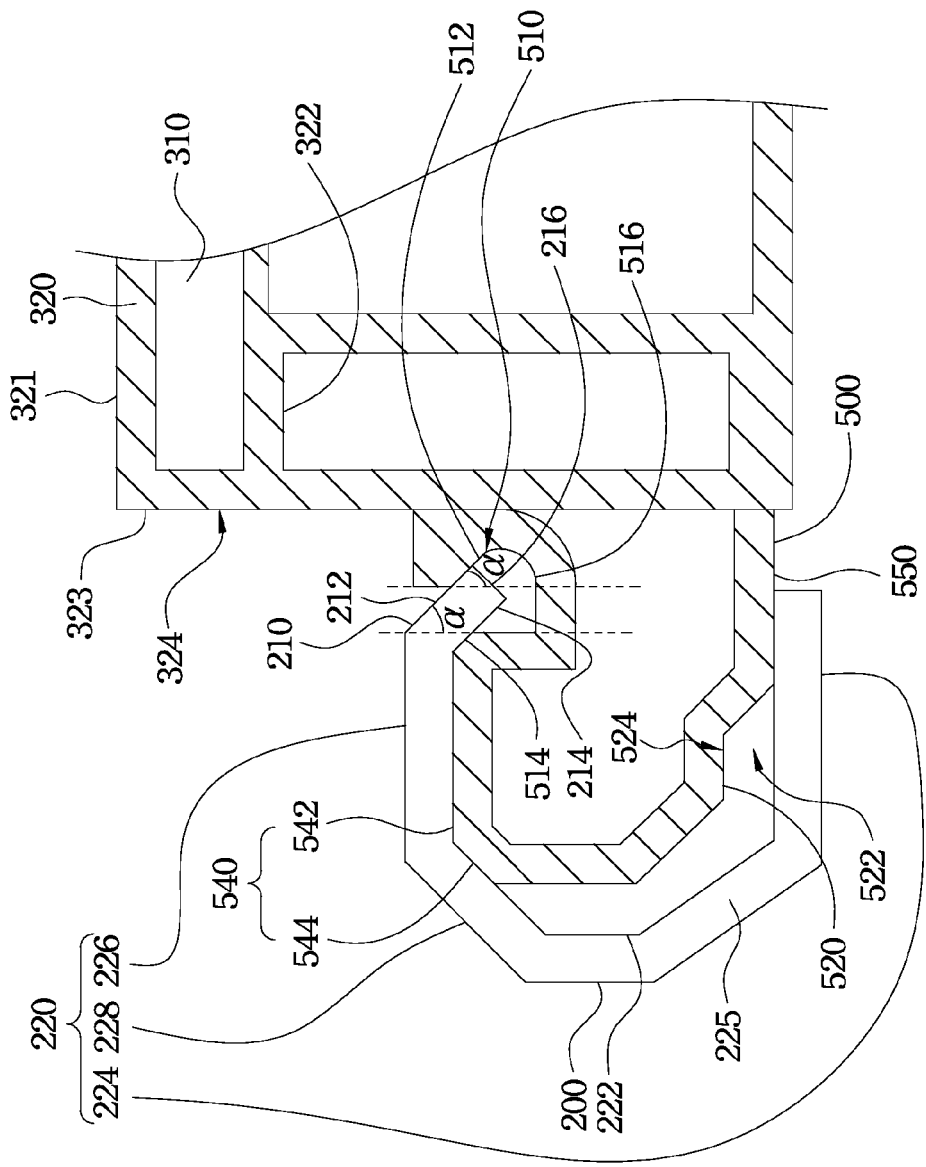
FIG. 3 is a cross-sectional view taken along a D-D' line in FIG. 2.

FIG. 2 is an enlarged perspective view of a partial region A in FIG. 1. FIG. 3 is a cross-sectional view taken along a D-D' line in FIG. 2. As shown in FIGS. 2 and 3, the frame 320 includes at least a pair of holding parts 321 and 322, a sidewall 323 and at least one protrusion 500. The edge of photovoltaic laminate 310 is engaged by the holding parts 321, 322 and a part of the sidewall 323. The holding parts 321 and 322 are connected by a part of the sidewall 323. The outside surface 324 on the sidewall 323 is defined on the opposite side to the photovoltaic laminate 310. The protrusion 500 is connected to the bottom part of the outside surface 324 on the sidewall 323. The protrusion 500 includes a slot 510 thereon. The slot 510 is used for engaging the first fastener 100 or the second fastener 200 and has a fan-shaped profile in a cross sectional view. The second fastener 200 has a C-shaped profile in a cross sectional view, and includes a third buckle part 210 at the top portion of the second fastener 200 for engaging with slot 510. The photovoltaic array may also include a second fixing element 600. The second fixing element 600 may be used for securing the second fastener 200 to the building structure 400.

As shown in FIGS. 2 and 3, the protrusion 500 with hollow structure is connected to the sidewall 323 of the frame 320 and on the opposite side to the photovoltaic laminate 310. The third buckle part 210 of the second fastener 200 may insert into the slot 510 of the protrusion 500 so as to secure the photovoltaic laminate 310 to the building structure 400. In other words, the photovoltaic laminate 310 can be secured to the building structure 400 without the rail and associated assembling kit so as to shorten the work time and reduce the rail cost as well.

In some embodiments, the protrusion 500 and the photovoltaic laminate 310 are separated by the sidewall 323 of the frame 320. That is, the protrusion 500 and the photovoltaic laminate 310 each are positioned on two opposite sides of the sidewall 323. The protrusion 500 and the frame 320 may be made of the same material or an integrally formed component.

In some embodiments, as shown in FIG. 3, the protrusion 500 includes a plurality of retaining parts 512, 514 which are respectively positioned on the two opposite sides of an opening of the slot 510. An arc-shaped inner wall 516 is defined in the slot 510 and is connected between the retaining part 512 and the retaining part 514. The retaining part 512 is close to the sidewall 323 and faces the slot 510. The retaining part 514 is positioned on the other side of the slot 510 and far from the sidewall 323 comparing to the retaining part 512. The third buckle part 210 of the second fastener 200 has a plurality of lateral surfaces 212, 214 opposite to each other and an end surface 216 for connecting the lateral surface 212 and the lateral surface 214. The lateral surface 212 is on the outer side of the third buckle part 210, while the lateral surface 214 is on the inner side of the third buckle part 210. The retaining part 512 is against the lateral surface 212 of the third buckle part 210. The retaining part 514 is against the lateral surface 214 of the third buckle part 210. The end surface 216 faces the inner wall 516 of the slot 510 with a gap therebetween. That is, the slot 510 clamps the third buckle part 210 with the two opposite retaining parts 512 and 514 and the gap exists between the third buckle part 210 and the inner wall 516 of the slot 510. The third buckle part 210 is unnecessary to contact the inner wall 516 so that the slot 510 may has a space for the third buckle part 210 rotating therein. By this way, the second fastener 200 can couple or separate from the protrusion 500 in a buckle way. It should be understood that, the "buckle" in the specification means that two objects couple to each other after a relative rotation and separate or remove from each other after a reverse rotation.

In some embodiments, the retaining parts 512, 514 each have a retaining surface (not shown) for contacting the third buckle part 210. An angle $\alpha$ is defined as between the retaining surface and the outside surface 324 of the frame 320 and is in the range of $20° \leq \alpha \leq 60°$. After the second fastener 200 is coupled with the protrusion 500, the angle $\alpha$ is also defines as between the lateral surfaces 212, 214 of the third buckle part 210 and the outer surface 324 of the frame 320. The angle $\alpha$ with this range may avoid the third buckle part 210 sliding out of the slot 510, so that the second fastener 200 and the protrusion 500 are fastened tightly. It should be understood that, a dotted line for defining the angle $\alpha$ shown in FIG. 3 is parallel to the outside surface 324.

In some embodiments, the second fastener 200 includes a limit part 220, which is connected with the third buckle part 210 to form the C-shaped structure in the cross section view. The limit part 220 may cover at least a portion of the protrusion 500 when they are engaged with each other. The protrusion 500 includes a first supporting part 540 and a yielding part 520. The first supporting part 540 is adjacent to the retaining part 514 of the slot 510 and is positioned at the top of the protrusion 500 with the hollow structure and contacts the limit part 220 of the second fastener 200. The yielding part 520 is adjacent to the first supporting part 540. The yielding part 520 separates from an inner surface 222 of the limit part 220 to define a yielding space 522 therebetween. Specifically, part of the inner surface 222 of the limit part 220 is not contacted with the yielding part 520 of the protrusion 500, and the yielding space 522 is partially enclosed by the part of the inner surface 222 and the yielding part 520.

In some embodiments, the first supporting part 540 of the protrusion 500 further includes a horizontal surface 542 and a sloping surface 544. The horizontal surface 542 is between the retaining surface of the retaining part 514 and the sloping surface 544. The sloping surface 544 slopes downward from the horizontal surface 542 toward the yielding part 520. The limit part 220 of the second fastener 200 further includes a horizontal subpart 226 and a sloping subpart 228. The horizontal subpart 226 is between the third buckle part 210 and the sloping subpart 228. An included angle between the horizontal subpart 226 and the sloping subpart 228 is substantially equal to the angle between the horizontal surface 542 and the sloping surface 544. Therefore, the horizontal surface 542 and part of the sloping surface 544 are tightly contacted the horizontal subpart 226 and part of the sloping subpart 228 without spacing so that the first supporting part 540 can support the limit part 220.

In some embodiments, the protrusion 500 has a second supporting part 550. The second supporting part 550 is positioned at the bottom of the protrusion 500 and is between the yielding part 520 and the sidewall 323. In addition to the horizontal subpart 226 and the sloping subpart 228, the limit part 220 may further include a terminal subpart 224, which is positioned on the other end part of the second fastener 200 and opposite to the third buckle part 210. The terminal subpart 224 is longer than the second supporting part 550. Therefore, the second supporting part 550 can contact part of the terminal subpart 224. That is, the first supporting part 540 and the second supporting part 550 are positioned on top and bottom sides of the protrusion 500 respectively, and the horizontal subpart 226 and the terminal subpart 224 of the limit part 220 are against the first supporting part 540 and the second supporting part 550, respectively, so as to cover at least a portion of the protrusion 500. It should be understood that, one part of the inner surface 222 of the limit part 220 including the horizontal subpart 226, the terminal subpart 224 and the sloping subpart 228 contacts the protrusion 500, and the other part of the inner surface 222 of the limit part 220 does not contact the protrusion 500. Additionally, the sloping subpart 228 slopes downward from one end of the horizontal subpart 226 opposite to the third buckle part 210 toward the terminal subpart 224.

In some embodiments, the yielding part 520 is between the first supporting part 540 and the second supporting part 550. Specifically, the yielding part 520 consists of plural bending parts 524. The number of the bending parts 524 is not limited as long as the second supporting part 550 and the horizontal surface 542 of the first supporting part 540 are parallel. Additionally, plural bending parts 225 also exist between the sloping subpart 228 and the terminal subpart 224 of the second fastener 200. A bending angle of the plural bending parts 225 of the second fastener 200 is slightly larger than the bending angle of the plural bending parts 524 of the yielding part 520, so that the yielding space 522 is formed between the bending parts 225 and the yielding part 520. The aforementioned description is only for illustrating the embodiment of the invention and not intended to limit the invention.

Figure 4A:
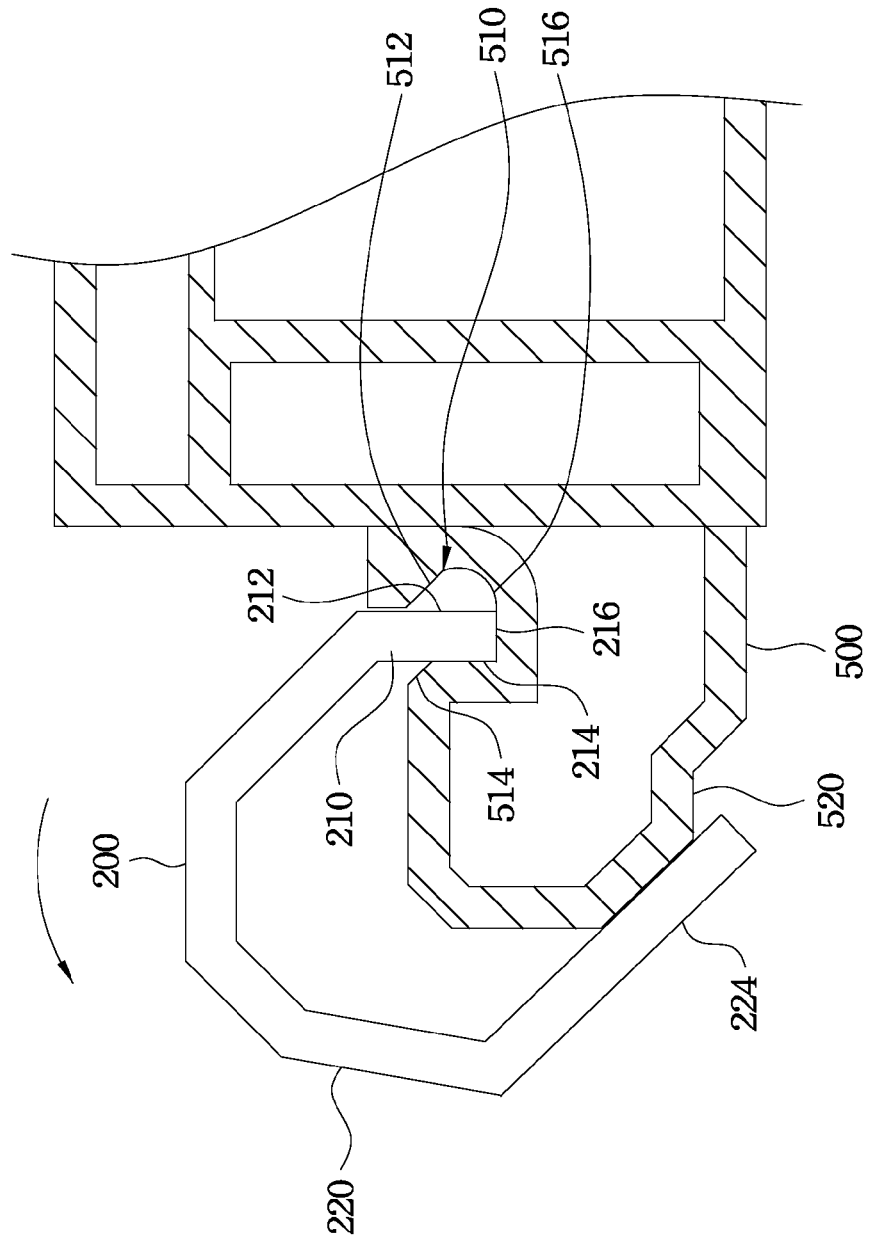
FIGS. 4A to 4D show steps for coupling a second fastener with a protrusion.

FIGS. 4A to 4D are steps for coupling the second fastener 200 with the protrusion 500. As shown in FIG. 4A, the worker may firstly insert the third buckle part 210 of the second fastener 200 into the slot 510, so that the end surface 216 of the third buckle part 210 contacts the inner wall 516 of the slot 510, and the terminal subpart 224 of the second fastener 200 also contacts the yielding part 520. Therefore, the third buckle part 210 stands in the slot 510.

Figure 4B:
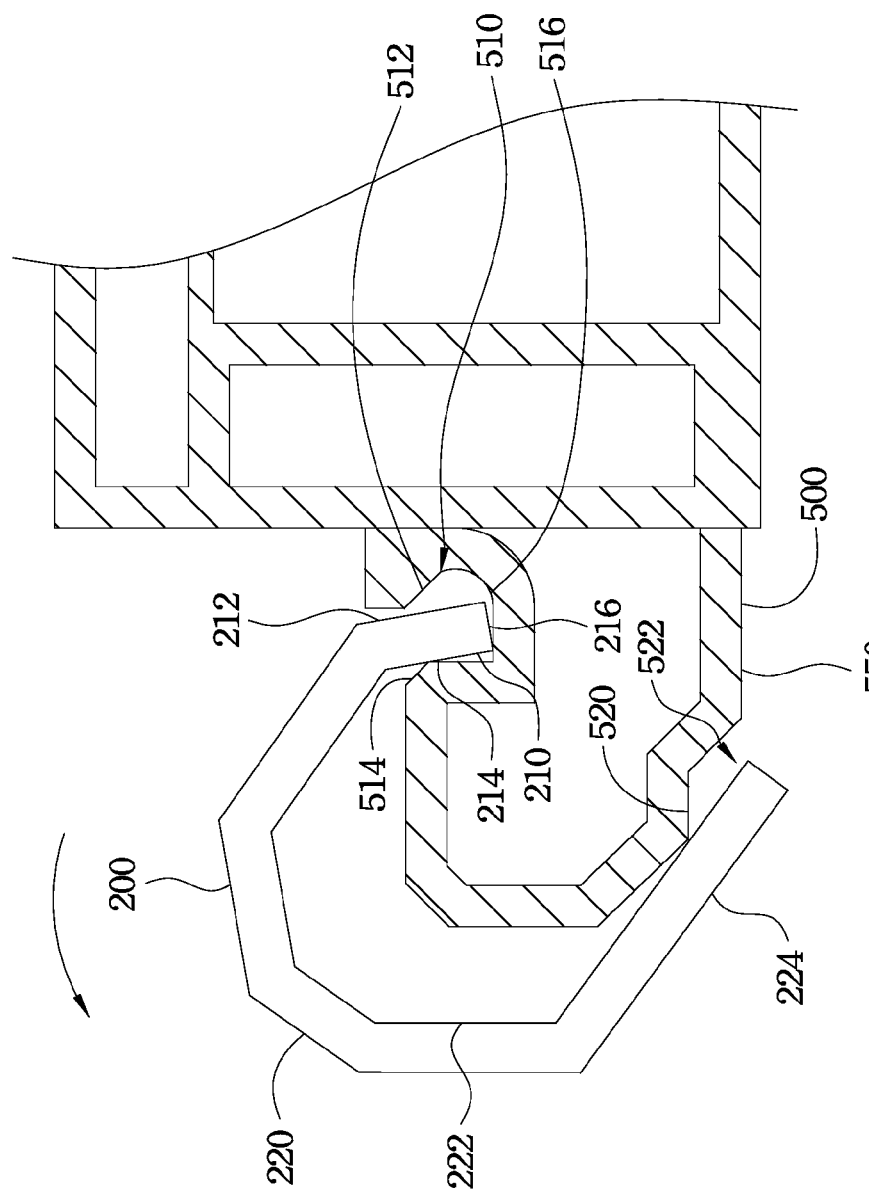

Next, as shown in FIG. 4B, the worker rotates the second fastener 200, so that the end surface 216 of the third buckle part 210 moves along the arc-shaped inner wall 516 of the slot 510. Specifically, the end surface 216 of the third buckle part 210 is rotated toward the retaining part 512, and meanwhile the terminal subpart 224 of the second fastener 200 is also approaching toward the second supporting part 550 along a transition point of the yielding part 520. Therefore, the limit part 220 may gradually cover the protrusion 500. Additionally, when the protrusion 500 is covered gradually by the limit part 220, the yielding part 520 does not contact the inner surface 222 of the limit part 220 so that the rotation of the second fastener 200 will not be interfered.

Figure 4C:
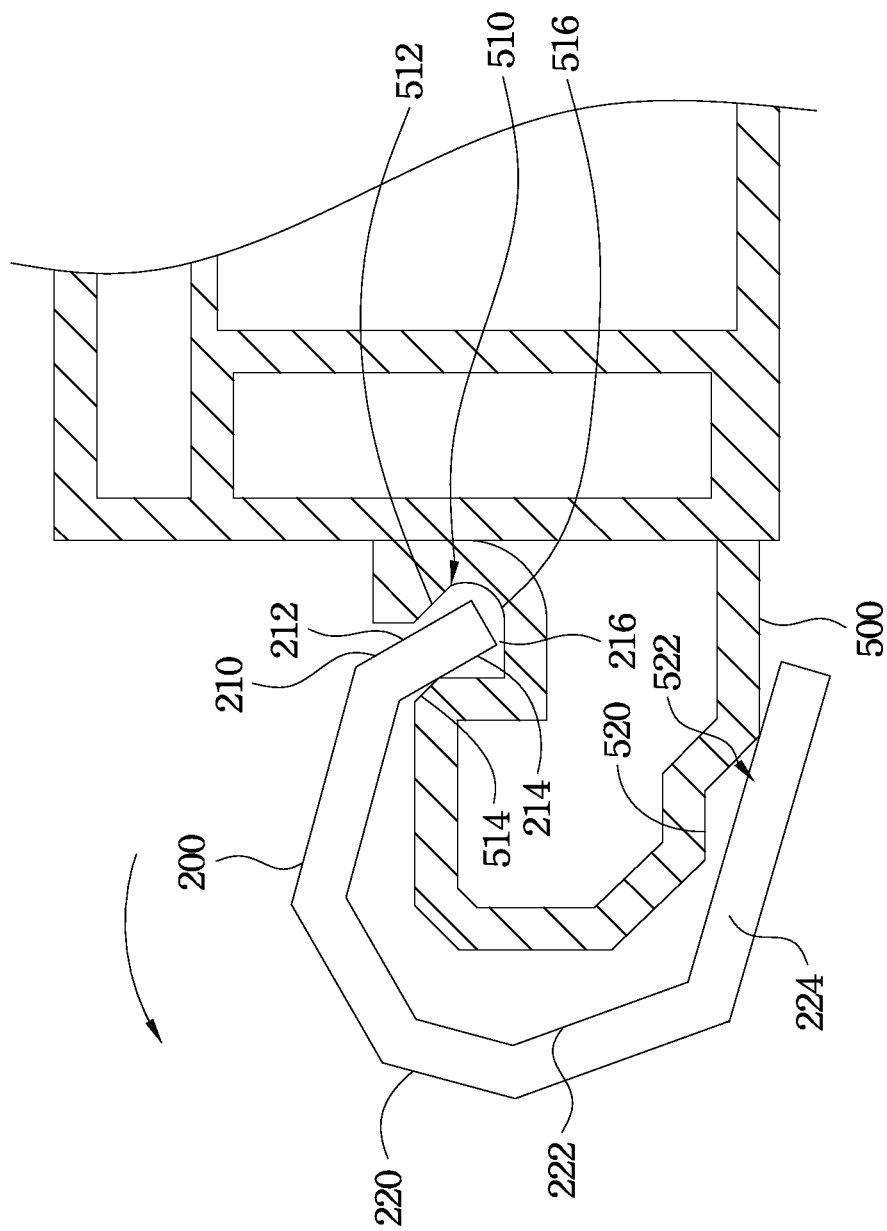

Next, as shown in FIG. 4C, since the yielding part 520 does not contact the inner surface 222 of the limit part 220, the worker can rotate the second fastener 200 without being interfered. At this moment, the terminal subpart 224 of the second fastener 200 approaches the transition point between the yielding part 520 and the second supporting part 550.

Figure 4D:
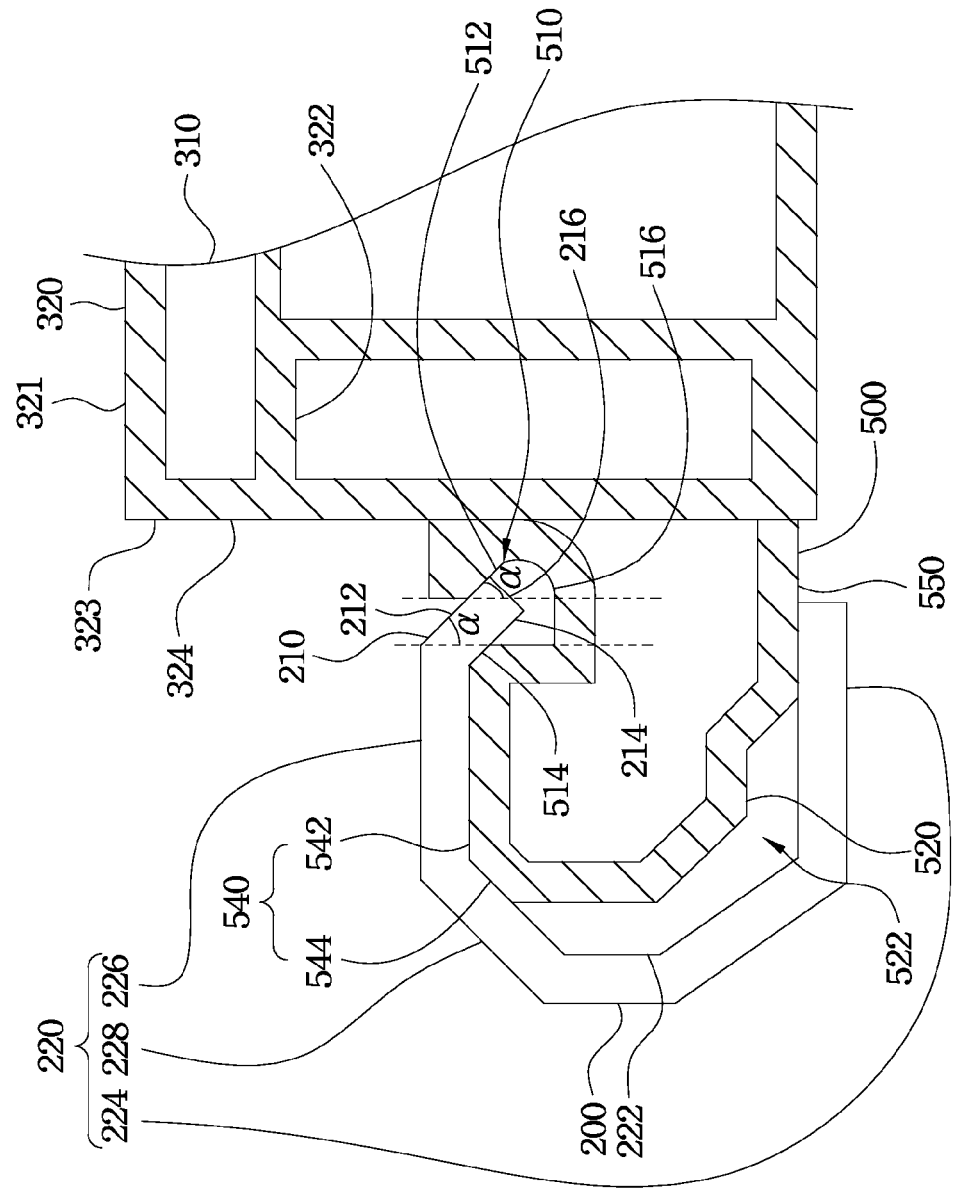

Finally, as shown in FIG. 4D, when the second fastener 200 is rotated to a final position, the retaining parts 512 and 514 will contact the lateral surfaces 212 and 214 of the second fastener 200 respectively. The first supporting part 540 of the protrusion 500 contacts the horizontal subpart 226 and the sloping subpart 228 of the limit part 220, and the second supporting part 550 contacts the terminal subpart 224, so that the second fastener 200 and the protrusion 500 are fastened and engaged with each other.

Finally, referring to FIG. 2 again, in some embodiments, the second fastener 200 may further include a plurality of second holes 230, which are respectively positioned on the horizontal subpart 226 and the terminal subpart 224 and aligned with each other. For example, the second holes 230 can be respectively positioned at the centers of the horizontal subpart 226 and the terminal subpart 224. One second fastener 200 may be used at the same time for engaging with two adjacent end parts of two protrusions 500 of two adjacent photovoltaic modules 300. When the second fixing element 600 passes through the second holes 230 of the second fastener 200, it just passes through an interval 330 between the two protrusions 500 of the two adjacent photovoltaic modules 300. Finally, the second fastener 200 and the protrusion 500 are secured to the building structure 400, and the two adjacent photovoltaic modules 300 are secured to the building structure 400. Specifically, the second fixing element 600 may be the screw or the bolt. The second hole 230 can be a screw hole for the second fixing element 600. However, the invention is not limited to the examples of the combinations of the screw, bolt and screw hole.

Referring to FIG. 1 again, plural photovoltaic modules 300 are disposed in rows along an X direction and disposed in columns along a Y direction. That is, the photovoltaic modules 300 arranged along the X direction may be considered the photovoltaic modules 300 in the same row, and the photovoltaic modules 300 arranged along the Y direction may be considered the photovoltaic modules 300 in the same column. The aforementioned X and Y directions are substantially perpendicular to each other. Referring to FIG. 2, the interval 330 is spaced between two adjacent photovoltaic modules 300 in the same row. Therefore, the second fastener 200 engages the two adjacent photovoltaic modules 300 in the same row at the same time and extended across the interval 330. That is, one second fastener 200 is used for fastening two adjacent photovoltaic modules 300 spatially separated from each other. Both of the lateral edges of the two frames of the two photovoltaic modules 300 arranged along the X direction have the protrusions 500. The two protrusions 500 are coaxially positioned for engaging with the second fastener 200. In some embodiments, the second fixing element 600 is positioned at the interval 330, so that the second fastener 200 is further fastened to the building 400.

Figure 5:
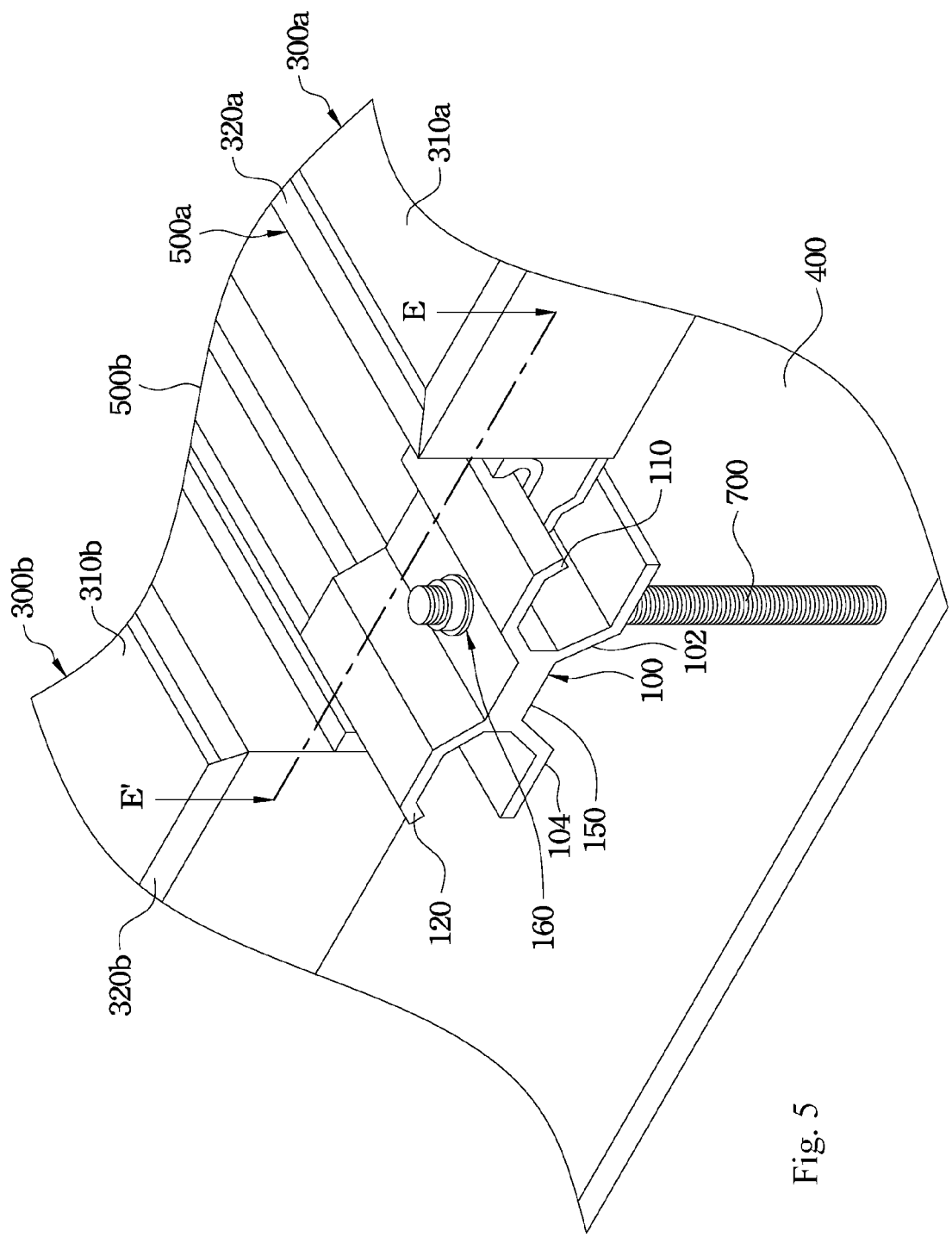
FIG. 5 is a perspective view of a partial region B in FIG. 1.
Figure 6:
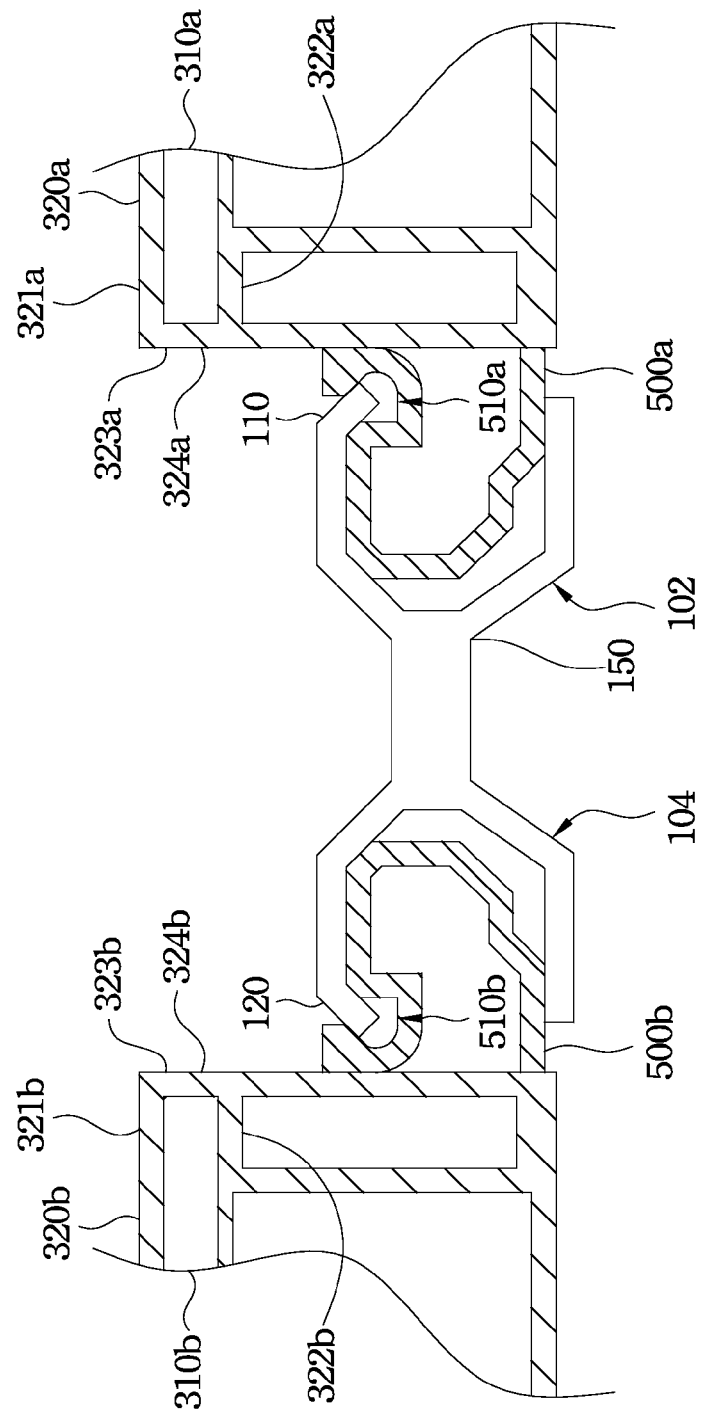
FIG. 6 is a cross-sectional view taken along an E-E' line in FIG. 5.

FIG. 5 is an enlarged perspective view of a partial region B in FIG. 1. FIG. 6 is a cross-sectional view taken along an E-E' line in FIG. 5. In order to make the reader understand the invention well, the photovoltaic modules in FIGS. 5 and 6 may be distinguished into a first photovoltaic module 300a and a second photovoltaic module 300b that are disposed adjacent to each other. The first photovoltaic module 300a may include a first photovoltaic laminate 310a and at least one first frame 320a. The first frame 320a includes a pair of first holding parts 321a and 322a, a first sidewall 323a and at least one first protrusion 500a. The edge of the first photovoltaic laminate 310a is enclosed by the first holding parts 321a, 322a and part of the first sidewall 323a. The first holding parts 321a and 322a are connected by a part of the first sidewall 323a. The outside surface 324a on the first sidewall 323a is defined as on the opposite side to the first photovoltaic laminate 310a. A first protrusion 500a is connected to the bottom part of the first outside surface 324a on the first sidewall 323a. The first protrusion 500a has a first slot 510a thereon. The second photovoltaic module 300b includes a second photovoltaic laminate 310b and at least one second frame 320b. The second frame 320b includes a pair of second holding parts 321b and 322b, a second sidewall 323b and at least one second protrusion 500b. The second photovoltaic laminate 310b is enclosed by the second holding parts 321b,322b and part of the second sidewall 323b. The second holding parts 321b and 322b are connected by a part of the second sidewall 323b. The second outside surface 324b on the second sidewall 323b is defined as on the opposite side to the second photovoltaic laminate 310b. A second protrusion 500b is connected to the bottom part of the second outside surface 324b on the second sidewall 323b. The second protrusion 500b has a second slot 510b thereon. The first fastener 100 is a "butterfly" shaped profile in the cross-sectional view, which includes a first fastening part 102, a second fastening part 104 opposite to the first fastening part 102, and a connecting part 150 connected therebetween. Both of the first fastening part 102 and the second fastening part 104 are C shaped profile in the cross-sectional view, and they are disposed on the different end of the connecting part 150 so that the first fastening part 102 and the second fastening part 104 are bilaterally symmetrical. The first fastening part 102 includes a first buckle part 110 at the top portion of the first fastening part 102. The second fastening part 104 includes a second buckle part 120 at the top portion of the second fastening part 104. The first buckle part 110 and the second buckle part 120 are positioned on the two opposite sides of the connecting part 150 respectively. Part of the first buckle part 110 and part of the second buckle part 120 engage the first slot 510a and the second slot 510b, respectively. The first fixing element 700 secures the first fastener 100 to the building structure 400.

As shown in FIG. 6, since part of the first buckle part 110 and part of the second buckle part 120 insert into the first slot 510a and the second slot 510b respectively, the first fastener 100 can secure the first photovoltaic panel 310a and the second photovoltaic panel 310b to the building structure 400 (referring to FIG. 5). In other words, at least one first photovoltaic panel 310a and at least one second photovoltaic panel 310b are secured to the building structure 400 without the rail and associated assembling kit so as to shorten the work time and reduce the long rail cost as well.

As shown in FIG. 5, the first fastener 100 may further have a first hole 160. The first fixing element 700 passes through the first hole 160 for securing the first fastener 100 to the building structure 400. Specifically, the first fixing element 700 may be the screw or the bolt. The first hole 160 may be the screw hole for the first fixing element 700. However, the invention is not limited to the examples of the combinations of the screw, bolt and screw hole. In some embodiments, the first hole 160 is provided on the connecting part 150 to avoid the first fixing element 700 interfering with the first protrusion 500a or the second protrusion 500b.

Figure 7:
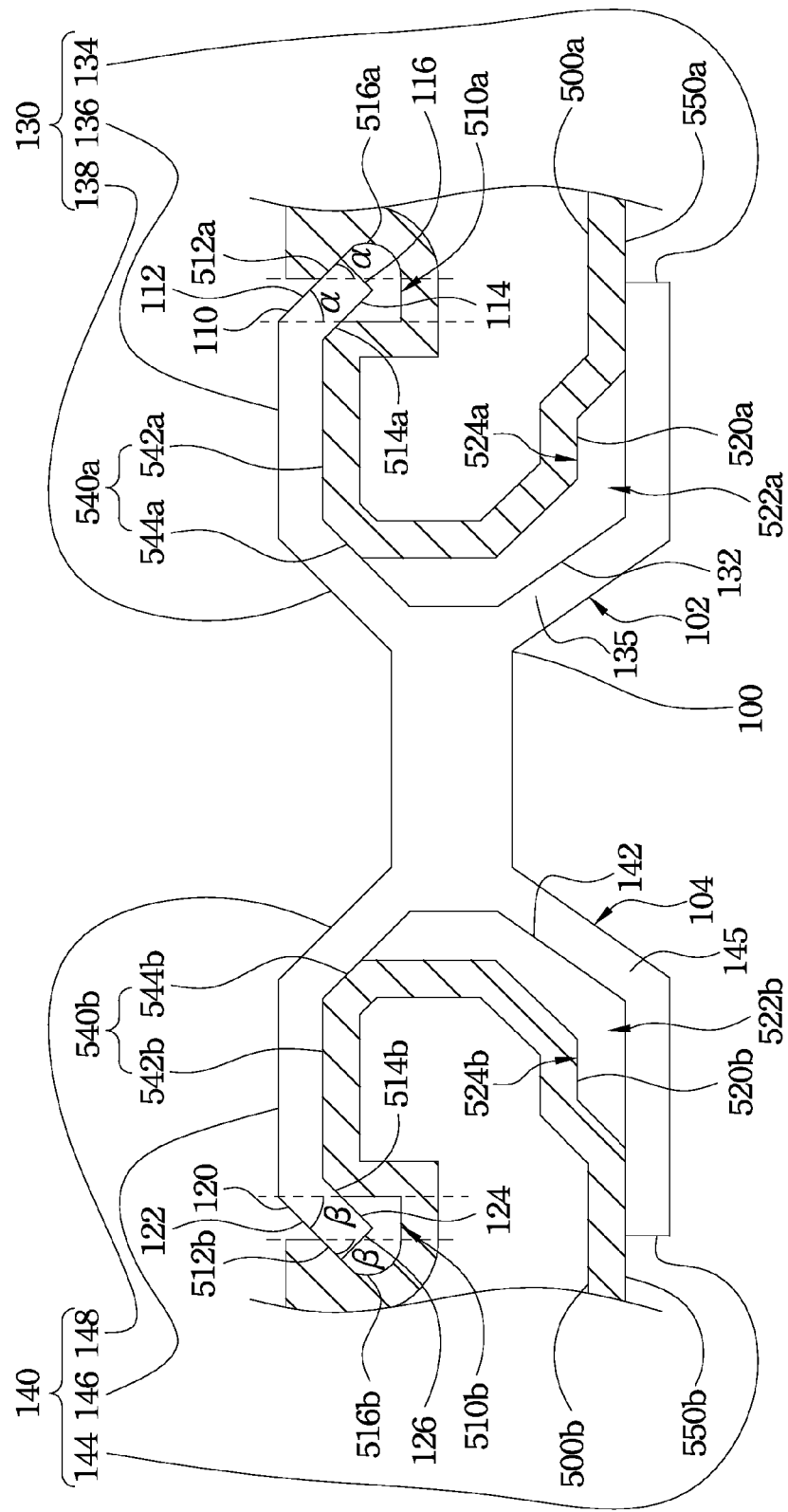
FIG. 7 is a partial enlarged view of FIG. 6.

FIG. 7 is a partial enlarged view of FIG. 6. As shown in FIG. 7, in some embodiments, the first protrusion 500a of the first photovoltaic panel 310a includes a plurality of first retaining parts 512a and 514a which are respectively positioned on the opposite two sides of the opening of the first slot 510a. The first slot 510a has an arc-shaped first inner wall 516a between the first retaining parts 512a and 514a. The first buckle part 110 includes a plurality of first lateral surfaces 112 and 114 opposite to each other and a first end surface 116 between the first lateral surfaces 112 and 114. The lateral surface 112 is positioned on the outer side the first buckle part 110 and the lateral surface 114 is positioned on the inner side the first buckle part 110. The first retaining part 512a contacts the first lateral surface 112. The first retaining part 514a contacts the first lateral surface 114. The first end surface 116 faces the first inner wall 516a with a gap therebetween. That is, the first slot 510a clamps the first buckle part 110 with two opposite first retaining parts 512a and 514a so that the gap exists between the first buckle part 110 and the first inner wall 516a of the first slot 510a, and the first buckle part 110 does not contact the first inner wall 516a. As a result, the first slot 510a may leave a certain space for the first buckle part 110 rotating therein, so that the first fastener 100 can couples or separates from the first protrusion 500a.

In some embodiments, the second protrusion 500b includes a plurality of second retaining parts 512b and 514b which are respectively positioned on the opposite two sides of the opening of the second slot 510b. The second slot 510b has an arc-shaped second inner wall 516b between the second retaining parts 512b and 514b. The second buckle part 120 has a plurality of second lateral surfaces 122 and 124 opposite to each other and a second end surface 126 between the second lateral surfaces 122 and 124. The lateral surface 122 is positioned on the outer side of the second buckle part 120 and the lateral surface 124 is positioned on the inner side of the second buckle part 120. The second retaining part 512b contacts the second lateral surface 122. The second retaining part 514b contacts the second lateral surface 124. The second end surface 126 faces the second inner wall 516b with a gap therebetween. As a result, the second slot 510b may leave a certain space for the second buckle part 120 rotating therein, so that the first fastener 100 can couples or separates from the second protrusion 500b.

During assembly, the worker may firstly insert the first buckle part 110 directly to the first slot 510a, and then rotate the first fastener 100, so that the first fastener 100 tightly couples the first protrusion 500a. Next, the worker may move the second frame 320b (referring to FIG. 6), and rotate the second frame 320b after the second buckle part 120 is accommodated in the second slot 510b, so that the first fastener 100 tightly couples the second protrusion 500b. Alternatively, the worker may also firstly insert the second buckle part 120 directly to the second slot 510b, and then rotate the first fastener 100, so that the first fastener 100 tightly couples the second protrusion 500b. Next, the worker may move the first frame 320a (referring to FIG. 6), and after the first buckle part 110 is accommodated in the first slot 510a, the worker may rotate the first frame 320a, so that the first fastener 100 tightly couples the first protrusion 500a.

In some embodiments, the first retaining parts 512a, 514a each have the retaining surface (not shown) for contacting the first buckle part 110, and the angle α is defined as between the retaining surface and the first outside surface 324a (referring to FIGS. 6 and 7) with the range of $20°\leq\alpha\leq60°$. After the first fastener 100 is engaged to the protrusion 500a, the angle α is also defined as between the first lateral surfaces 112, 114 of the first buckle part 110 and the first outside surface 324a of the frame 320a. The angle α within the range can avoid the first buckle part 110 sliding out of the first slot 510a, so that the first fastener 100 tightly couples the first protrusion 500a. It should be understood that, the dotted line for defining the alpha angle shown in FIG. 7 is parallel to the first outside surface 324a.

In some embodiments, the second retaining parts 512b, 514b each have the retaining surface (not shown) for contacting the second buckle part 120, and an angle β is defined as between the retaining surface and the second outside surface 324b (referring to FIGS. 6 and 7) with the range of $20°\leq\beta\leq60°$. After the first fastener 100 is engaged to the protrusion 500b, the angle β is also defined as between the second lateral surfaces 122, 124 of the second buckle part 120 and the second outside surface 324b of the frame 320b. The angle β within the range may avoid the second buckle part 120 sliding out of the second slot 510b, so that the first fastener 100 tightly couples the second protrusion 500b. It should be understood that, the dotted line for defining the angle β shown in FIG. 7 is parallel to the second outside surface 324b.

In some embodiments, the first fastener 100 may further include a first limit part 130, which is connected to the first buckle part 110, to form the C-shaped structure in the cross section view. The first limit part 130 covers at least a portion of the first protrusion 500a when the first fastener 100 couples with the first protrusion 500a. The first protrusion 500a includes a first supporting part 540a and a first yielding part 520a. The first supporting part 540a is connected to the first retaining part 514 of the first slot 510a and contacts the first limit part 130 of the first fastener 100. The first yielding part 520a is connected to the first supporting part 540a. The first yielding part 520a is separated from an inner surface 132 of the first limit part 130 to define a first yielding space 522a therebetween. Specifically, part of the inner surface 132 of the first limit part 130 does not contact the first yielding part 520a of the first protrusion 500a. The first yielding space 522a is enclosed by the part of the inner surface 132 and the first yielding part 520a.

In some embodiments, the first fastener 100 may further include a second limit part 140, which is connected to the second buckle part 120, to form the C-shaped structure in the cross section view. The second limit part 140 covers at least a portion of the second protrusion 500b when the first fastener 100 couples with the second protrusion 500b. The second protrusion 500b has a third supporting part 540b and a second yielding part 520b. The third supporting part 540b is connected to the second retaining part 514b of the second slot 510b and contact the second limit part 140 of the first fastener 100. The second yielding part 520b is connected to the third supporting part 540b. The second yielding part 520b is separated from an inner surface 142 of the second limit part 140 to define a second yielding space 522b therebetween. Specifically, part of the inner surface 142 of the second limit part 140 does not contact the second yielding part 520b of the second protrusion 500b. The second yielding space 522b is enclosed by the part of the inner surface 142 and the second yielding part 520b.

In some embodiments, the first supporting part 540a of the first protrusion 500a includes a first horizontal surface 542a and a first sloping surface 544a. The first horizontal surface 542a is connected between the retaining surface of the first retaining part 514a and the first sloping surface 544a. The first sloping surface 544a slopes downward from the first horizontal surface 542a toward the first yielding part 520a. The first limit part 130 of the first fastener 100 includes a first horizontal subpart 136 and a first sloping subpart 138. The first horizontal subpart 136 is connected between the first buckle part 110 and the first sloping subpart 138. The included angle between the first horizontal subpart 136 and the first sloping subpart 138 is substantially equal to the included angle between the first horizontal surface 542a and the first sloping surface 544a. As a result, the first horizontal surface 542a and the first sloping surface 544a tightly contact the first horizontal subpart 136 and the first sloping subpart 138, so as to facilitate the first supporting part 540a to support the first limit part 130.

Specifically, the third supporting part 540b of the second protrusion 500b includes a second horizontal surface 542b and a second sloping surface 544b. The second horizontal surface 542b is connected between the retaining surface of the second retaining part 514b and the second sloping surface 544b. The second sloping surface 544b slopes downward from the second horizontal surface 542b toward the second yielding part 520b. The second limit part 140 of the first fastener 100 may include a second horizontal subpart 146 and a second sloping subpart 148. The second horizontal subpart 146 is connected between the second buckle part 120 and the second sloping subpart 148. The included angle between the second horizontal subpart 146 and the second sloping subpart 148 is substantially equal to the included angle between the second horizontal surface 542b and the second sloping surface 544b. As a result, the second horizontal surface 542b and the second sloping surface 544b tightly contact with the second horizontal subpart 146 and the second sloping subpart 148 without spacing, so as to facilitate the third supporting part 540b to support the second limit part 140.

In some embodiments, the first protrusion 500a has a second supporting part 550a, which is positioned at the bottom of the first protrusion 500a and is adjacent between the first yielding part 520a and the first sidewall 323a. In addition to the first horizontal subpart 136 and the first sloping subpart 138, the first limit part 130 further include a first terminal subpart 134, which is positioned on the other end of the first fastening part 102 opposite to the first buckle part 110. The second supporting part 550a contacts part of the first terminal subpart 134. Since the first limit part 130 contacts both of the first supporting part 540a and the second supporting part 550a, at least a portion of the first protrusion 500a may be covered. It should be understood that, one part of the inner surface 132 of the first limit part 130 including the first horizontal subpart 136, the first terminal subpart 134 and the first sloping subpart 138 contacts the first protrusion 500a, and the other part of the inner surface 132 of the first limit part 130 does not contact the first protrusion 500a. The first sloping subpart 138 slopes downward from one end of the first horizontal subpart 136 opposite to the first buckle part 110 toward the first terminal subpart 134.

In some embodiments, the second protrusion 500b has a fourth supporting part 550b, which is positioned at the bottom of the second protrusion 500b and is adjacent between the second yielding part 520b and the second sidewall 323b. In addition to the second horizontal subpart 146 and the second sloping subpart 148, the second limit part 140 further include a second terminal subpart 144, which is positioned on the other end of the second fastening part 104 opposite to the second buckle part 120. The fourth supporting part 550b contacts part of the second terminal subpart 144. Since the second limit part 140 contacts both of the third supporting part 540b and the fourth supporting part 550b, at least a portion of the second protrusion 500b may be covered. It should be understood that, one part of the inner surface 142 of the second limit part 140 including the second horizontal subpart 146, the second terminal subpart 144 and the second sloping subpart 148 contacts the second protrusion 500b, and the other part of the inner surface 142 of the second limit part 140 does not contact the second protrusion 500b. The second sloping subpart 148 slopes downward from one end of the second horizontal subpart 146 opposite to the second buckle part 120 toward the second terminal subpart 144.

In some embodiments, the first yielding part 520a is positioned between the first supporting part 540a and the second supporting part 550a. Specifically, the first yielding part 520a consists of plural first bending parts 524a. The number of the first bending parts 524a is not limited as long as the second supporting part 550a and the second horizontal surface 542a of the first supporting part 540a are parallel. Additionally, plural bending parts 135 are also included between the first sloping subpart 138 and the first terminal subpart 134 of the first fastening part 102. The bending angle of the plural bending parts 135 of the first fastening part 102 is slightly larger than the bending angle of the plural first bending parts 524a of the first yielding part 520a, so that the first yielding space 522a is formed therebetween. The aforementioned description is only used for illustrating the embodiment of the invention and not intended to limit the invention.

In some embodiments, the second yielding part 520b is positioned between the third supporting part 540b and the fourth supporting part 550b. Similarly, the second yielding part 520b consists of plural second bending parts 524b. The number of the second bending parts 524b is not limited as long as the fourth supporting part 550b and the second horizontal surface 542b of the third supporting part 540b are parallel. Additionally, plural second bending parts 145 are also included between the second sloping subpart 148 and the second terminal subpart 144 of the second fastening part 104. The bending angle of the plural second bending parts 145 of the second fastening part 104 is slightly larger than the bending angle of the plural second bending parts 524b of the second yielding part 520b, so that the second yielding space 522b is formed therebetween. The aforementioned description is only used for illustrating the embodiment of the invention and not intended to limit the invention.

In the aforementioned embodiment, the first fastening part 102 and the second fastening part 104 are connected with the connecting part 150 respectively through the first limit part 130 and the second limit part 140. The first fastener 100 including the first fastening part 102, the second fastening part 104 and the connecting part 150 is the integrally formed component.

Figure 8:
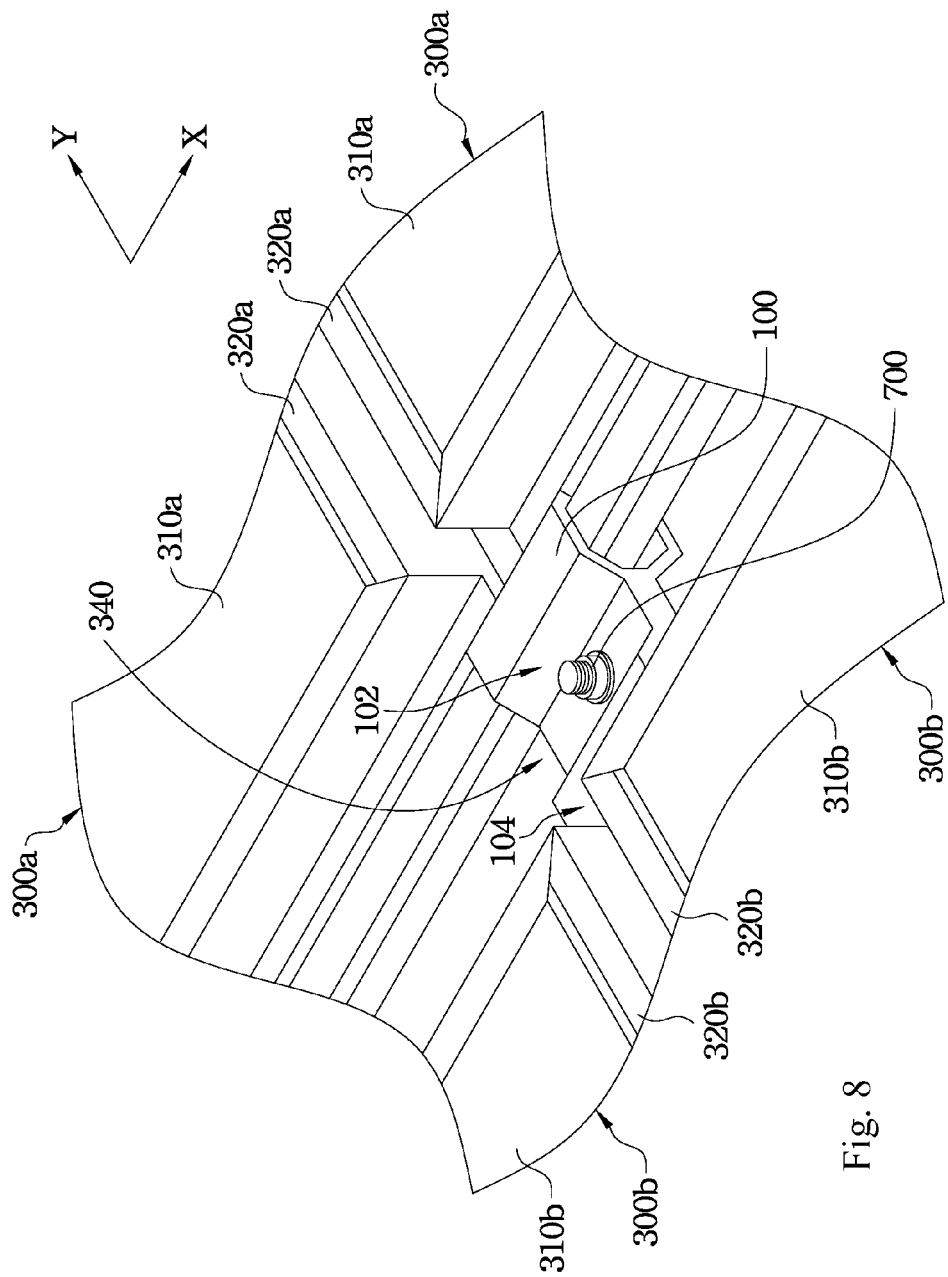
FIG. 8 is a perspective view of a partial region C in FIG. 1.

FIG. 8 is an enlarged perspective view of a partial region C in FIG. 1. As shown in FIG. 8, there is an interval center 340 between two adjacent first photovoltaic modules 300a in the same row and two adjacent second photovoltaic modules 300b in the same row. The phrase "in the same row" described above means the objects arranged along the X direction. The first fastener 100 couples the first photovoltaic modules 300a and the second photovoltaic modules 300b, and extends across the interval center 340. In other words, two first photovoltaic modules 300a are arranged along the X direction, and the first photovoltaic modules 300a and the second photovoltaic modules 300b are arranged along the Y direction. Therefore, these first photovoltaic modules 300a and the second photovoltaic modules 300b may be arranged into a 2×2 array, and the interval center 340 is at a symmetric position among the above four photovoltaic modules. The first fastener 100 is positioned in the interval center 340 and couples these first photovoltaic modules 300a and the second photovoltaic modules 300b. The first fastening part 102 of the first fastener 100 couples two sets of the first photovoltaic modules 300a at the same time. The second fastening part 104 couples two sets of the second photovoltaic modules 300b at the same time. Therefore, a single first fastener 100 couples four photovoltaic modules at the same time, so as to reduce the material cost greatly.

In some embodiments, the first fixing element 700 is positioned in the interval center 340 to avoid interfering with the first photovoltaic modules 300a or the second photovoltaic modules 300b around.

Figure 9:
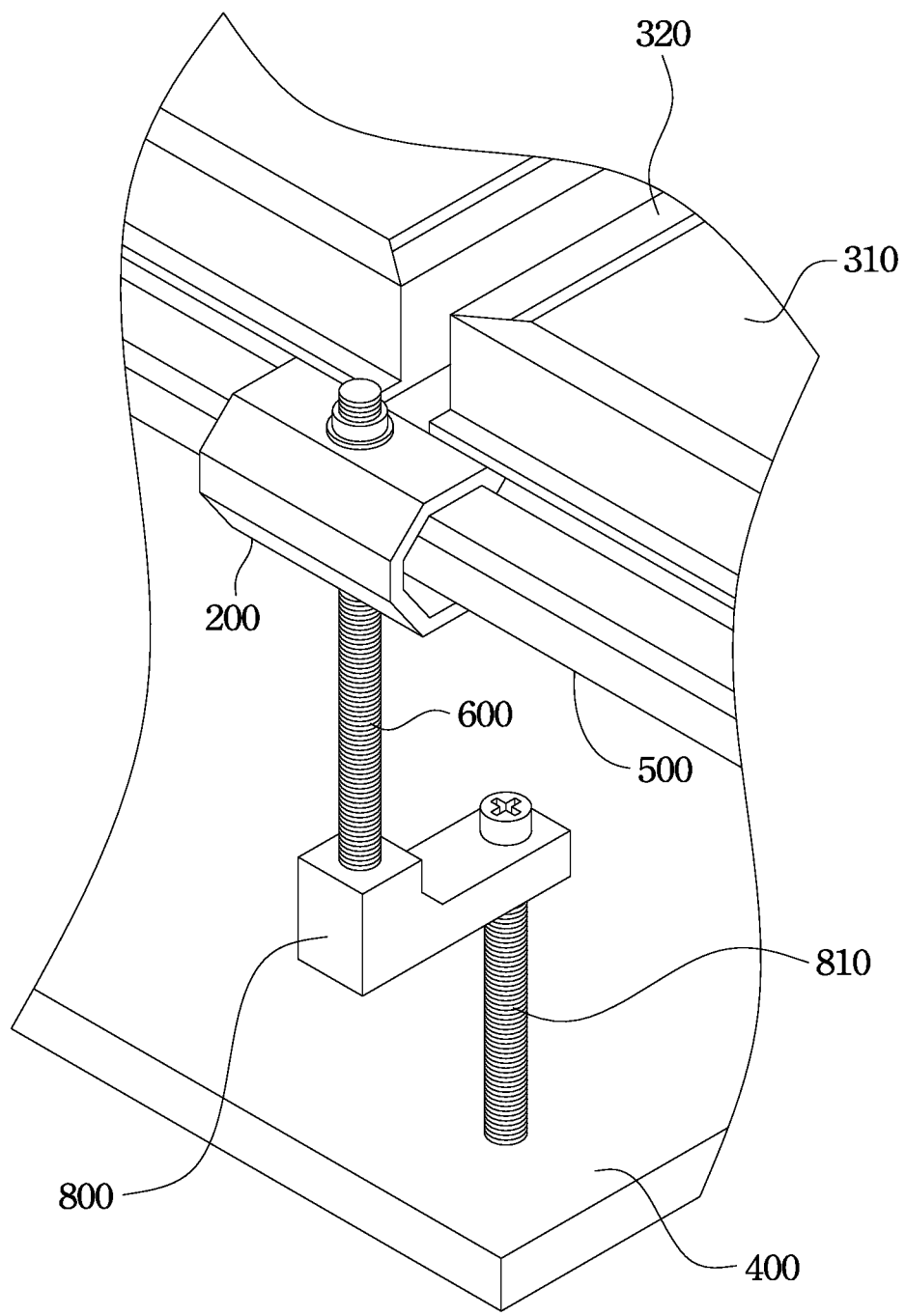
FIG. 9 is a partial perspective view of the photovoltaic array according to another embodiment of the invention.
Figure 10:
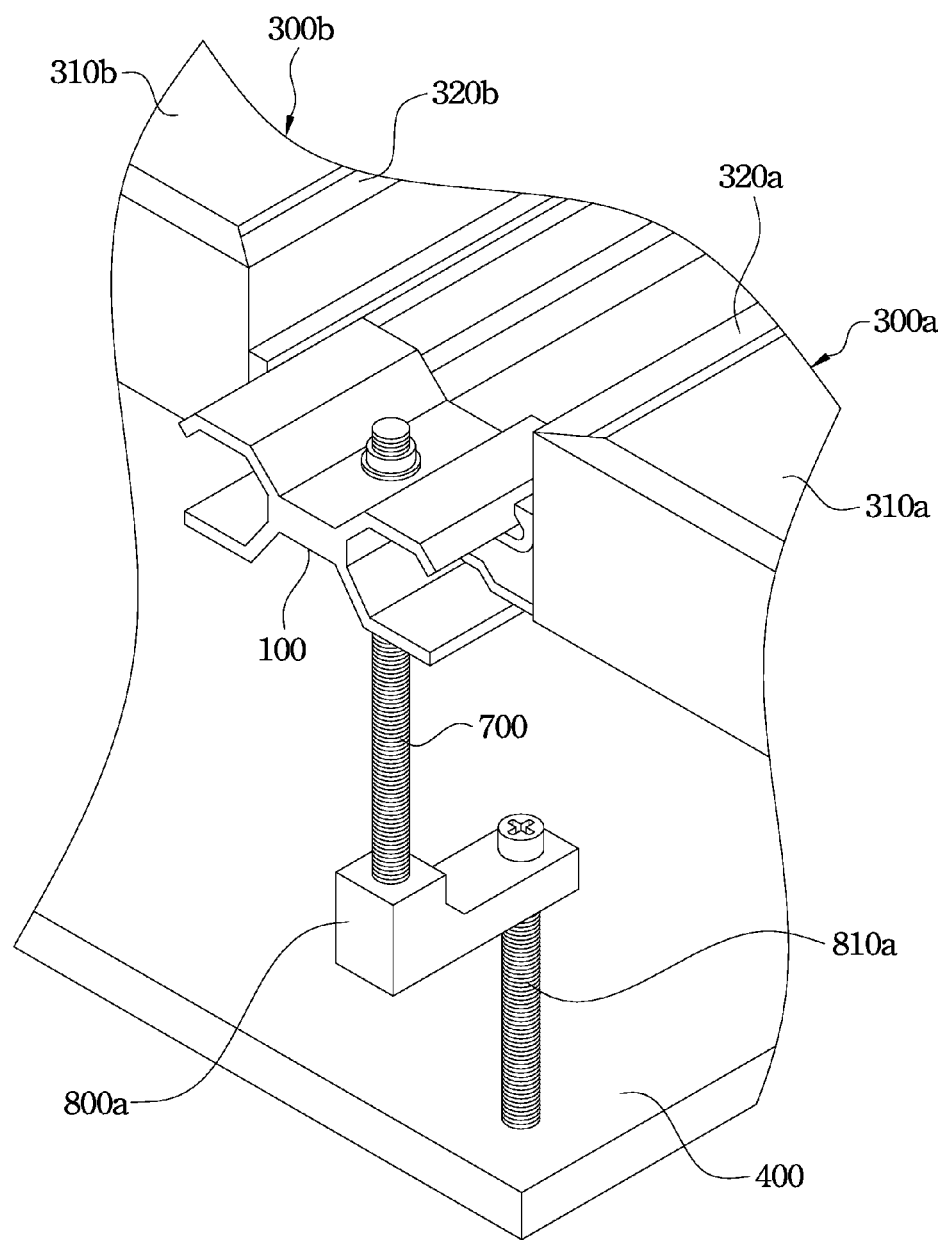
FIG. 10 is a partial perspective view of the photovoltaic array according to another embodiment of the invention.

Referring to FIG. 1 again, as shown in the figure, the second fastener 200 is secured to the building structure 400. For the convenience of directly fastening the second fastener 200, the building structure 400 is preferably a non-brittle building material, for example, cement, but is not limited to this. If the building structure 400 is covered with a brittle building material (for example, a ceramic roof tile), the worker may utilize an bolt 810 to secure a bearing seat 800 to the building structure 400 before the brittle building material is covered on the building structure 400 (referring to FIG. 9), and then the second fastener 200 is fastened to the bearing seat 800 through the second fixing element 600 (as shown in FIG. 9). Additionally, the worker may utilize an bolt 810a to fasten a bearing seat 800a to the building structure 400 before the brittle building material is covered on the building structure 400 (referring to FIG. 10), and the first fastener 100 is fastened to the bearing seat 800a through the first fixing element 700 (as shown in FIG. 10). Finally, the brittle building material is covered on the bearing seats 800 and 800a. Therefore, it may be avoided that the brittle building material is damaged by the first fixing element 700 and the second fixing element 600.

Although the invention has been disclosed with reference to the embodiments, these embodiments are not intended to limit the invention. It will be apparent to those skilled in the art that various modifications and variations can be made without departing from the spirit and scope of the invention. Therefore, the scope of the invention shall be defined by the appended claims.

What is claimed is:

1. A photovoltaic apparatus, comprising:
   at least one photovoltaic laminate having a light receiving surface;
   at least one frame disposed on at least one lateral edge of the photovoltaic laminate, wherein the frame comprises:
   at least a pair of holding parts, wherein the photovoltaic laminate is clamped between the holding parts;
   a sidewall, wherein part of the sidewall connects the holding parts, and the sidewall has an outside surface opposite to the photovoltaic laminate; and
   at least one protrusion connected to the outside surface of the sidewall, wherein the protrusion has a slot thereon, wherein the protrusion projects outside of an outer edge of the said at least one photovoltaic laminate and said sidewall, and wherein the protrusion includes a plurality of retaining parts which are respectively positioned on two opposite sides of an opening of the slot and an arc-shaped inner wall is defined in the slot and is connected between the retaining parts; and at least one fastener for coupling with the protrusion, wherein the fastener comprises a buckle part at the top portion of the fastener, and part of the buckle part is engaged to the slot of the protrusion.

2. The photovoltaic apparatus of claim 1, wherein one of the retaining parts contacts the sidewall.

3. The photovoltaic apparatus of claim 2, wherein the buckle part of the fastener has two opposite lateral surfaces for contacting the retaining parts on the two opposite sides of the opening of the slot.

4. The photovoltaic apparatus of claim 2, wherein the retaining parts of the protrusion respectively have a retaining surface, and an angle $\alpha$ is defined as between the retaining surface and the outside surface of the sidewall in the range of $20° \leq \alpha \leq 60°$.

5. The photovoltaic apparatus of claim 1, wherein the fastener comprises a limit part connected to the buckle part to form a C-shaped structure in a cross sectional view, and the limit part covers at least a portion of the protrusion when the fastener is coupled with the protrusion.

6. The photovoltaic apparatus of claim 5, wherein the protrusion has a first supporting part connected to one side of the slot and positioned at the top portion of the protrusion for supporting the limit part of the fastener.

7. The photovoltaic apparatus of claim 6, wherein the protrusion has a second supporting part opposite to the first supporting part and positioned at the bottom of the protrusion, and the second supporting part is adjacent to the bottom of the sidewall of the frame.

8. The photovoltaic apparatus of claim 7, wherein the limit part of the fastener includes a terminal subpart on the other end of the fastener opposite to the buckle part for contacting part of the second supporting part.

9. The photovoltaic apparatus of claim 1, wherein the fastener is used for coupling two adjacent photovoltaic laminates in the same row at end portions of two coaxial protrusions of the two adjacent frames.

10. The photovoltaic apparatus of claim 1, wherein the fastener comprises a limit part which has a horizontal subpart connecting the buckle part, and a terminal subpart on the other end part of the fastener which is substantially parallel to the horizontal subpart.

11. A photovoltaic module, comprising:
a photovoltaic laminate having a light receiving surface;
a plurality of frames respectively disposed on a plurality of lateral edges of the photovoltaic laminate, wherein each of the frames comprises:
a pair of holding parts for holding the photovoltaic laminate; and
a sidewall, wherein part of the sidewall connects the holding parts, and the sidewall has an outside surface opposite to the photovoltaic laminate; and
at least one protrusion, wherein the protrusion is a hollow structure which connects the outside surface of the sidewall and includes a slot thereon, wherein the protrusion projects outside of an outer edge of the said at least one photovoltaic laminate and said sidewall,
and wherein the protrusion includes a plurality of retaining parts which are respectively positioned on
two opposite sides of an opening of the slot and an arc-shaped inner wall is defined in the slot
and is connected between the retaining parts.

12. The photovoltaic module of claim 11, wherein the retaining parts of the protrusion respectively have a retaining surface, and an angle $\alpha$ is defined as between the retaining surface and the outside surface of the sidewall in the range of $20° \leq \alpha \leq 60°$.

13. The photovoltaic module of claim 11, wherein the protrusion has a first supporting part connected to one of the retaining parts of the slot and disposed at the top portion of the protrusion; the protrusion further has a second supporting part opposite to the first supporting part and disposed at the bottom of the protrusion and is adjacent to the bottom of the sidewall.

14. The photovoltaic module of claim 11, wherein the protrusion and the frame are made of the same material or integrally formed.

* * * * *